(12) United States Patent
Savoj (10) Patent No.: US 7,230,461 B1
(45) Date of Patent: Jun. 12, 2007

(54) RETIMING CIRCUITS FOR PHASE-LOCKED LOOPS

(75) Inventor: Jafar Savoj, Sunnyvale, CA (US)

(73) Assignee: Marvell International, Ltd., Hamilton (BM)

( * ) Notice: Subject to any disclaimer, the term of this patent is extended or adjusted under 35 U.S.C. 154(b) by 0 days.

(21) Appl. No.: 10/973,757

(22) Filed: Oct. 26, 2004

Related U.S. Application Data (60) Provisional application No. 60/584,759, filed on Jun. 29, 2004.

(51) Int. Cl.
*H03L 7/06* (2006.01)
(52) U.S. Cl. ............... 327/156; 327/90; 327/99; 327/159
(58) Field of Classification Search ............. None
See application file for complete search history.

(56) References Cited

U.S. PATENT DOCUMENTS

| | | | |
|---|---|---|---|
| 6,542,017 B2* | 4/2003 | Manganaro | 327/291 |
| 6,597,229 B1* | 7/2003 | Koyata et al. | 327/333 |
| 6,861,881 B1* | 3/2005 | Neravetla et al. | 327/115 |
| 6,864,722 B2* | 3/2005 | Adkisson | 327/12 |

* cited by examiner

*Primary Examiner*—Timothy P. Callahan
*Assistant Examiner*—An T. Luu

(57) ABSTRACT

Circuits and methods for retiming a frequency-divided clock are provided. A first sampling circuit samples the frequency-divided clock with a rising edge of a sampling clock. A second sampling circuit samples the frequency-divided clock with a falling edge of the sampling clock. A multiplexer in communication with the first and second sampling circuits selects one of the samples as a retimed version of the frequency-divided clock. The particular sample selected is preferably the sample less likely to produce an erroneous retimed version of the frequency-divided clock.

56 Claims, 5 Drawing Sheets

FIG. 1

(Prior Art)

RETIMING CIRCUITS FOR PHASE-LOCKED LOOPS

This claims the benefit of U.S. Provisional Application No. 60/584,759, filed Jun. 29, 2004, which is hereby incorporated by reference herein in its entirety.

BACKGROUND OF THE INVENTION

This invention relates to phase-locked loops (PLLs). More particularly, this invention relates to PLLs with improved retiming circuits.

PLLs are widely used in many applications. Typically, PLLs output one or more clock signals locked to both the phase and frequency of a reference clock. PLLs lock the output clock(s) to the reference clock by adjusting the phase and frequency of a PLL internal oscillator.

In one PLL implementation, sometimes referred to as a frequency-multiplying PLL, the PLL adjusts the frequency of the internal oscillator ($f_{OSC}$) to a frequency equal to the reference clock frequency ($f_{REF}$) multiplied by n (i.e., $f_{OSC}=n*f_{REF}$). The PLL locks the phase of the internal oscillator to the reference clock. A clock output by the internal oscillator is frequency divided by n before the divided clock is compared to the reference clock by a phase/frequency detector.

Frequency dividing a clock output by a PLL oscillator produces spurs (i.e., unwanted frequency components) in the frequency spectrum of the divided clock. These spurs undesirably modulate the output of the phase/frequency detector, which increases the total jitter produced by the PLL and therefore degrades the integrity of the PLL output clock(s). Some PLLs use retiming circuits to reduce amplitudes of the spurs. A PLL retiming circuit typically receives the divided clock as input, and outputs a retimed clock for comparison to the reference clock.

Conventional retiming circuits sample the frequency-divided clock with the PLL oscillator clock. This produces a retimed clock with reduced spur levels, but can cause the retimed clock to be erroneous when the sampling occurs during a logic transition of the divided clock (e.g., a transition from logic "0" to logic "1"). Particularly, samples taken during a logic transition of the divided clock may have voltages insufficient for comparison to the reference clock. Additionally, the voltage sampled during a logic transition of the divided clock may be attributable to the spurs in the divided clock, and not to a desired component of the divided clock at the reference clock frequency. The likelihood that conventional retiming circuits will produce an erroneous retimed clock increases with process and temperature variations.

In view of the foregoing, it would be desirable to provide PLL retiming circuits that are less likely to produce an erroneous retimed clock.

SUMMARY OF THE INVENTION

It is an object of this invention to provide improved retiming circuits for phase-locked loops (PLLs).

In accordance with this invention, a retiming circuit that includes a first sampling circuit, a second sampling circuit and a multiplexer is provided. Each of the first and second sampling circuits may include a plurality of latches coupled in series. The first sampling circuit samples a frequency-divided clock with a rising edge of a sampling clock. This sampling clock may be an output clock of a PLL internal oscillator. A second sampling circuit samples the frequency-divided clock with a falling edge of the sampling clock. A multiplexer in communication with the first and second sampling circuits selects one of the samples as a retimed version of the frequency-divided clock. The particular sample selected is preferably the sample less likely to produce an erroneous retimed version of the frequency-divided clock.

The invention also provides methods for retiming a frequency-divided clock.

Further features of the invention, its nature and various advantages, will be more apparent from the accompanying drawings and the following detailed description of the preferred embodiments.

BRIEF DESCRIPTION OF THE DRAWINGS

The above and other objects and advantages of the invention will be apparent upon consideration of the following detailed description, taken in conjunction with the accompanying drawings, in which like reference characters refer to like parts throughout, and in which.

DETAILED DESCRIPTION OF THE INVENTION

The invention relates to circuits and methods for retiming a clock output by a phase-locked loop (PLL) frequency divider.

Figure 1:
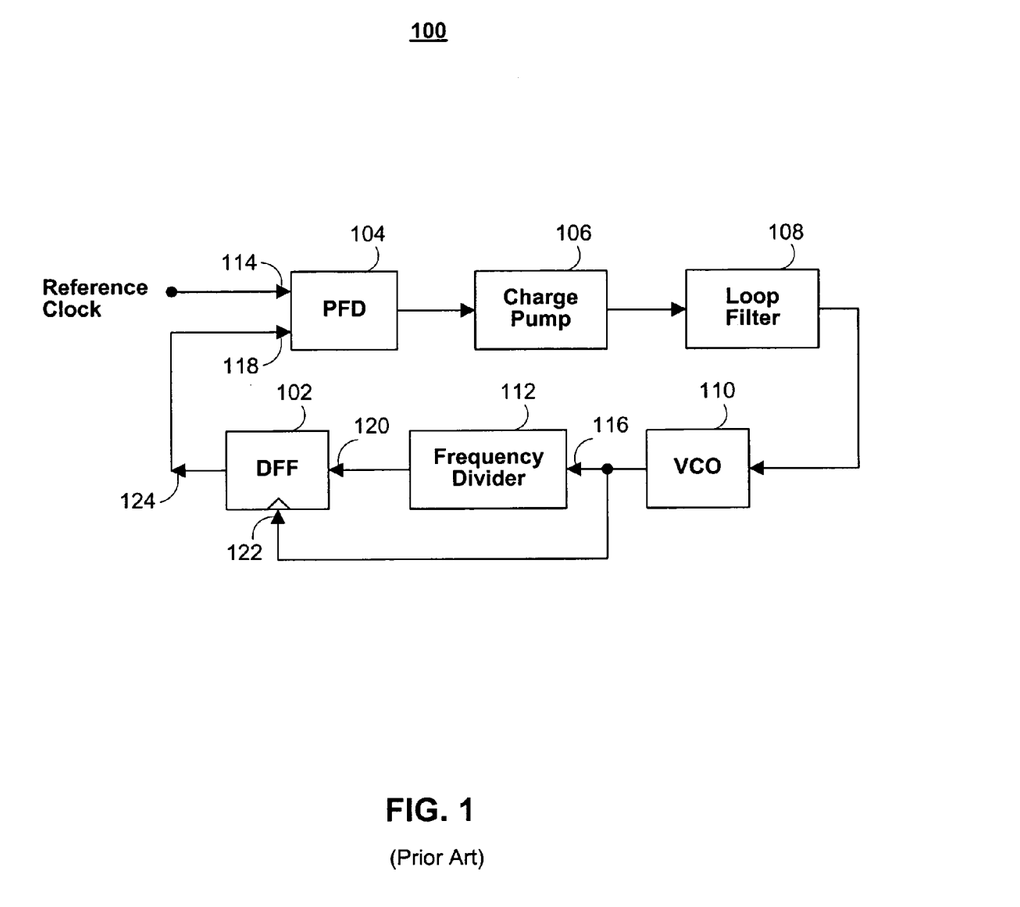
FIG. 1 is a block diagram of a phase-locked loop that includes a conventional retiming circuit.

FIG. 1 shows a PLL 100 that includes a conventional retiming circuit consisting of D flip flop 102. PLL 100 also includes phase/frequency detector (PFD) 104, charge pump 106, loop filter 108, voltage-controlled oscillator (VCO) 110 and divide-by-n frequency divider 112. PLL 100 is sometimes referred to as a frequency-multiplying PLL. PLL 100 receives a reference clock having a frequency ($f_{REF}$) at input 114. PFD 104, charge pump 106 and loop filter 108 adjust the frequency ($f_{OSC}$) of VCO 110 to a frequency equal to the reference clock frequency multiplied by n (i.e., $f_{OSC}=n*f_{REF}$). PLL components 104, 106 and 108 lock the phase of VCO 110 to the phase of the reference clock. Frequency divider 112 receives a clock output by VCO 110 at input 116, and outputs a divided clock having a frequency equal to the oscillator frequency divided by n, or equivalently, the reference clock frequency (i.e., $f_{OSC}/n=(n*f_{REF})/n=f_{REF}$). For reasons described below, the frequency spectrum of the divided clock also includes unwanted frequency components referred to as "spurs". These spurs undesirably modulate the output of phase/frequency detector 104, which increases the total jitter produced by PLL 100 and therefore degrades the integrity of the PLL output clock(s). D flip flop 102 reduces amplitudes of the spurs by sampling the divided clock with a clock output by VCO 110 (e.g., the same VCO clock received by frequency divider 112). D flip flop 102 outputs a retimed clock to input 118 of PFD 104 for comparison to the reference clock. Retiming of the divided clock by D flip flop 102 is described in greater detail below.

Frequency divider 112 typically includes m divide-by-two circuits coupled in series (e.g., one or more serially-coupled D flip flops) that collectively form a divide-by-n circuit. This number m is equal to $\log_2(n)$, or equivalently, $n=2^m$. Frequency divider 112 outputs a divided clock having a desired frequency component at the reference clock frequency ($f_{REF}$) and having spurs at frequencies ($f_{SPUR(i)}$) which satisfy the following equation:

$$f_{SPUR(i)}=f_{REF}*2^i \; 1 \leq i \leq m$$

Particularly, each divide-by-two circuit in the serially-coupled chain of divider circuits receives a clock having a particular frequency ($f_{SPUR(i)}$) as input. These input clocks pass through the serially-coupled chain of dividers to the output of frequency divider 112, where the frequencies of these clocks are observed as spurs in the frequency spectrum of the divided clock. The waveform (y(t)) of the divided clock can be expressed as follows:

$$y(t)=A_0*\cos(2\pi*f_{REF}*t)+3 \; A_i*\cos(2\pi*f_{SPUR(i)}*t+\phi_i)$$

where $A_O$ and $f_{REF}$ are the amplitude and frequency of the desired component of the divided clock and $A_1$–$A_m$, $f_{SPUR(1)}$–$f_{SPUR(m)}$, $\phi_1$–$\phi_m$ are, respectively, the amplitudes, frequencies and phase offsets of the spurs in the divided clock.

For example, when frequency divider 112 includes m=6 serially-coupled divide-by-2 circuits, frequency divider 112 divides the VCO clock received at input 116 by $n=2^6=64$. Thus, when the frequency of the VCO clock ($f_{OSC}$) is equal to 10 GHz and the reference clock frequency ($F_{REF}$) is equal to 156.25 MHz, such a frequency divider 112 outputs a divided clock having a desired frequency equal to $f_{REF}$ ($f_{OSC}/n=(10 \text{ GHz})/64=156.25 \text{ MHz}=f_{REF}$). The frequency spectrum of the divided clock also includes m=6 spurs, one spur for each of the m divide-by-two circuits. The spurs are observed in the divided clock at frequencies equal to (156.25 MHz)*$2^1$, (156.25 MHz)*$2^2$, (156.25 MHz)*$2^3$, (156.25 MHz)*$2^4$ (156.25 MHz)*$2^5$ and (156.25 MHz)*$2^6$, or equivalently, 312.5 MHz, 625 MHz, 1.25 GHz, 2.5 GHz, 5 GHz and 10 GHz.

D flip flop 102 receives the divided clock at input 120 and a clock output by VCO 110 at input 122. In response receiving a clock edge (e.g., a rising edge) of the VCO clock, D flip flop 102 outputs to output 124 a retimed clock having a voltage indicative of the logic value (i.e., logic "0" or logic "1") of the divided clock. In general, the voltage output to output 124 is the voltage of the divided clock just prior to the clock edge. Thus, when the clock edge is received during or shortly after a logic transition of the divided clock (e.g., a transition from logic "0" to logic "1"), the voltage output to output 124 is between the voltages corresponding respectively to a logic "0" and a logic "1". Typically, the voltage corresponding to a logic "1" is a positive voltage and the voltage corresponding to a logic "0" is a negative voltage. Thus, D flip flop 102 may output a retimed clock having a voltage equal to about zero when D flip flop 102 samples the divided clock during a logic transition of the divided clock. Such a voltage may be insufficient for comparison to the reference clock. Additionally, the voltage sampled during the logic transition may be attributable to the spurs in the divided clock, and not to the desired frequency component of the divided clock at the reference clock frequency. The likelihood that D flip flop 102 will sample the divided clock during a logic transition of the divided clock increases with process and temperature variations. This likelihood also increases as m increases because each divide-by-2 circuit adds to the time delay of frequency divider 112, which increases uncertainty regarding when the divided clock will transition logic values. This latter problem could be addressed by retiming the output of each divide-by-two circuit in the serially coupled chain of divider circuits (e.g., interspersing m D flip flops 102 into the serially-coupled chain of dividers of frequency divider 112). However, such an approach undesirably increases circuit complexity and power consumption, and does not address the likelihood of erroneous sampling due to process and temperature variations.

Figure 2:
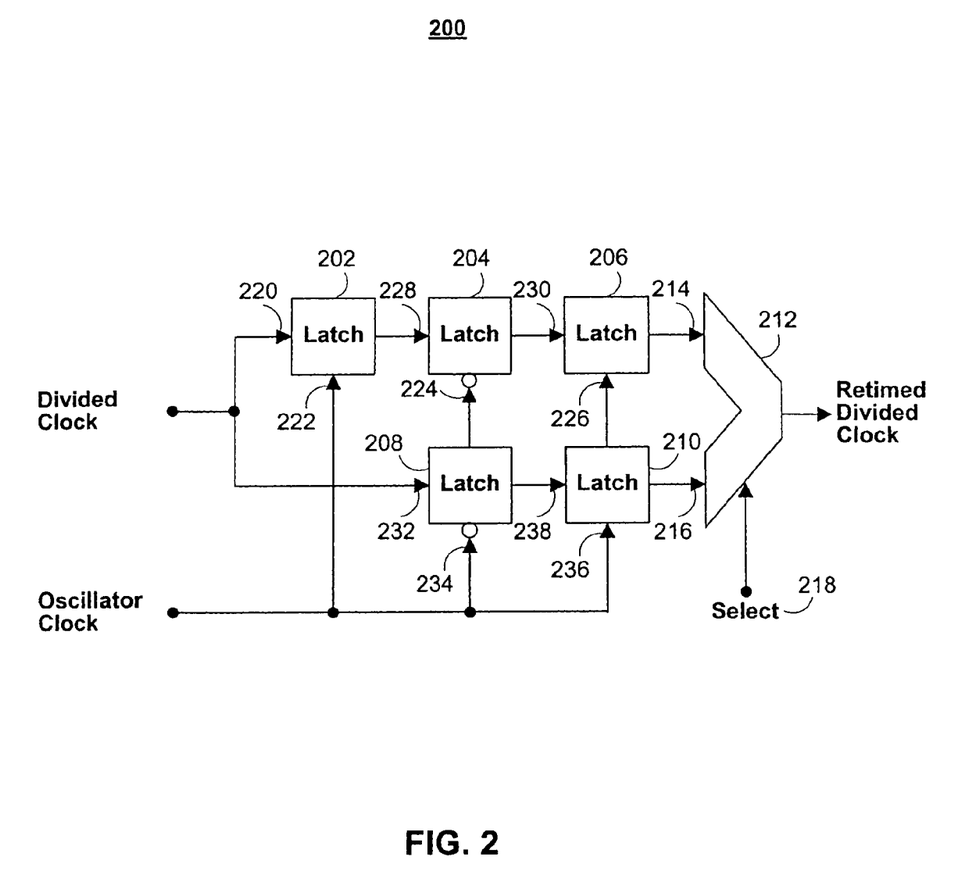
FIG. 2 is a block diagram of a retiming circuit in accordance with the present invention.

FIG. 2 shows a retiming circuit 200 in accordance with the present invention. Retiming circuit 200 is described herein as being used in connection with phase/frequency detector 104, charge pump 106, loop filter 108, VCO 110 and frequency divider 112 of FIG. 1. In other embodiments of the present invention, retiming circuit 200 may be used with any other suitable PLL circuitry. For example, instead of using circuit 200 with VCO 110 which is analog-controlled by charge pump 106 and loop filter 108, retiming circuit 200 may be used with a PLL internal oscillator that is digitally-controlled by one or more digital control signals generated by suitable PLL logic circuitry. As another example, frequency divider 112 may be a programmable frequency divider operative to provide a plurality of dividing factors n. Such a frequency divider may include m serially-coupled divider circuits (e.g., m divide by 2 circuits) and a programmable switch. The programmable switch may receive outputs of the divider circuits and may select one of the outputs as the output of frequency divider 112 based on the desired value of n. Providing a programmable frequency divider advantageously allows circuit 200 to be used in connection with reference clocks of various frequencies. Retimer circuit 200 may be implemented as part of a wireline transceiver that sends data over a cable (e.g., a 10 Gigabit/second SONET cable or 10 Gigabit/second Ethernet cable).

Retimer circuit 200 includes latches 202, 204, 206, 208 and 210 and multiplexer 212. Latches 202, 204 and 206 form a first sampling circuit that samples the divided clock output by frequency divider 112 with the rising edge of a clock output by VCO 110. Latches 202, 204 and 206 output this first sample to input 214 of multiplexer 212. Latches 208 and 210 form a second sampling circuit that samples the divided clock with the falling edge of the VCO clock. Latches 208 and 210 output this second sample to input 216 of multiplexer 212. Because the first sampling circuit includes one more latch than the second sampling circuit, the samples taken by these sampling circuits are received at inputs 214 and 216 of multiplexer 212 at the same time. This prevents the retimed clock from phase shifting responsive to changes in the particular sample selected by multiplexer 212. Multiplexer 212 selects one of the samples received at inputs 214 and 216 as the retimed clock of circuit 200. Particularly, SELECT control signal 218 causes multiplexer 212 to select from these samples the sample less likely to have been taken during a logic transition of the divided clock. As described above, samples taken during a logic transition of the divided clock may be erroneous. Circuitry suitable for generating SELECT control signal 218 is described below in connection with FIGS. 3 and 4. Multiplexer 212 is preferably implemented such that the input not selected to provide the retimed clock injects only a minimal amount of noise if any to the output of multiplexer 212.

Latches 202, 204 and 206 sample the divided clock with the rising edge of a clock output by VCO 110 as follows:

Latch 202 receives the divided clock at input 220 and the VCO clock at input 222. Latches 204 and 206 also receive the VCO clock at respective inputs 224 and 226. In response to latch 202 receiving a rising edge of the VCO clock, latch 202 outputs a voltage indicative of a logic value (i.e., logic "0" or logic "1") of the divided clock to input 228 of latch 204. In general, the voltage output by latch 202 is the voltage of the divided clock at the time of the rising edge. Latch 204 outputs this first sample to input 230 of latch 206 in response to latch 204 receiving a falling edge of the VCO clock. Latch 206 outputs the first sample to input 214 of multiplexer 212 in response to latch 206 receiving a rising edge of the VCO clock.

Latches 208 and 210 sample the divided clock with the falling edge of the VCO clock as follows: Latch 208 receives the divided clock at input 232 and the VCO clock at input 234. Latch 210 also receives the VCO clock at input 236. In response to latch 208 receiving a falling edge of the VCO clock, latch 208 outputs a voltage indicative of a logic value of the divided clock to input 238 of latch 210. Latch 210 outputs this second sample to input 216 of multiplexer 212 in response to latch 210 receiving a rising edge of the VCO clock.

Figure 3:
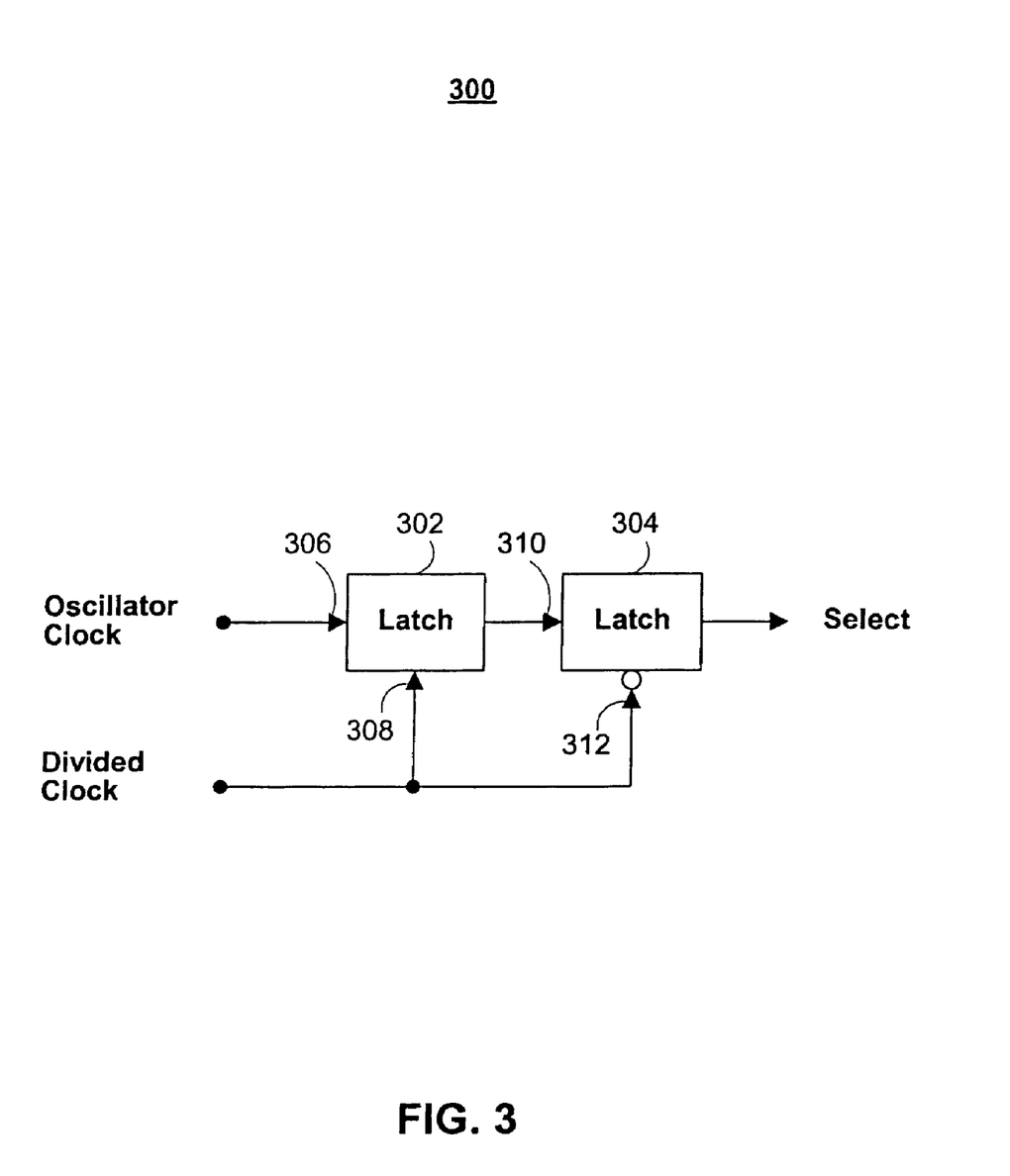
FIG. 3 is a block diagram of a control circuit suitable for controlling the retiming circuit of FIG. 2 in accordance with the present invention.

FIG. 3 shows a control circuit 300 suitable for generating SELECT control signal 218 (FIG. 2) in accordance with the present invention. Control circuit 300 includes latches 302 and 304 that form a lead/lag detector operative to determine whether the divided clock leads or lags the VCO clock. When the divided clock leads the VCO clock, the sample of the divided clock taken with the rising edge of the VCO clock (i.e., the sample received at input 214) should be selected by multiplexer 212. This is because the rising edge of the VCO clock is less likely to occur during a logic transition of the divided clock than the falling edge when the divided clock leads the VCO clock. Thus, control circuit 300 outputs a logic "0" SELECT signal 218 that causes multiplexer 212 to select the sample received at input 214 as the retimed clock. When the divided clock lags the VCO clock, the sample of the divided clock taken with the falling edge of the VCO clock (i.e., the sample received at input 216) should be selected by multiplexer 212. This is because the falling edge of the VCO clock is less likely to occur during a logic transition of the divided clock than the rising edge when the divided clock lags the VCO clock. Thus, control circuit 300 outputs a logic "1" SELECT signal 218 that causes multiplexer 212 to select input 216 as the retimed clock. In particular, latch 302 receives the VCO clock at input 306 and the divided clock at input 308. In response to latch 302 receiving a rising edge of the divided clock, latch 302 outputs a voltage indicating the logic value (i.e., logic "0" or logic "1") of the VCO clock to input 310 of latch 304. Latch 304 outputs the logic value received at input 310 to multiplexer 212 as SELECT signal 218 in response to latch 304 receiving a falling edge of the divided clock at input 312.

Figure 4A:
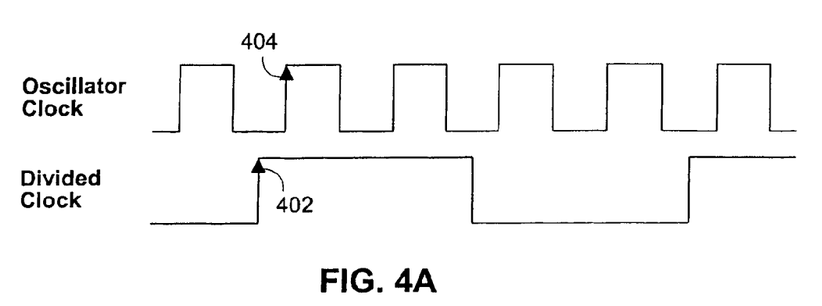
FIGS. 4A and 4B are timing diagrams illustrating operation of the control circuit of FIG. 3.

FIG. 4A shows the case in which control circuit 300 causes multiplexer 212 to select the sample received at input 214 as the retimed clock. As shown, the divided clock leads the VCO clock, which causes rising edge 402 of the divided clock to sample a logic "0" of the VCO clock. This indicates that rising edge 404 of the VCO clock occurs after the logic transition of the divided clock when the divided clock has a voltage sufficient for comparison to the reference clock. Control circuit outputs this logic "0" as SELECT signal 218, which causes multiplexer to select input 214.

Figure 4B:
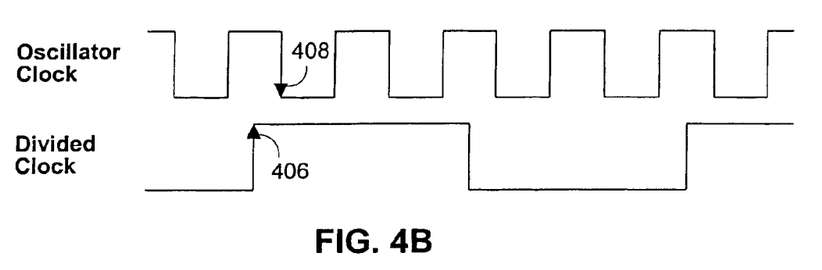

FIG. 4B shows the case in which control circuit 300 causes multiplexer 212 to select the sample received at input 216 as the retimed clock. As shown, the divided clock lags the VCO clock, which causes rising edge 406 of the divided clock to samples a logic "1" of the VCO clock. This indicates that falling edge 408 of the VCO clock occurs after the logic transition of the divided clock when the divided clock has a voltage sufficient for comparison to the reference clock. Control circuit outputs this logic "1" as SELECT signal 218, which causes multiplexer to select input 216.

Figure 5:
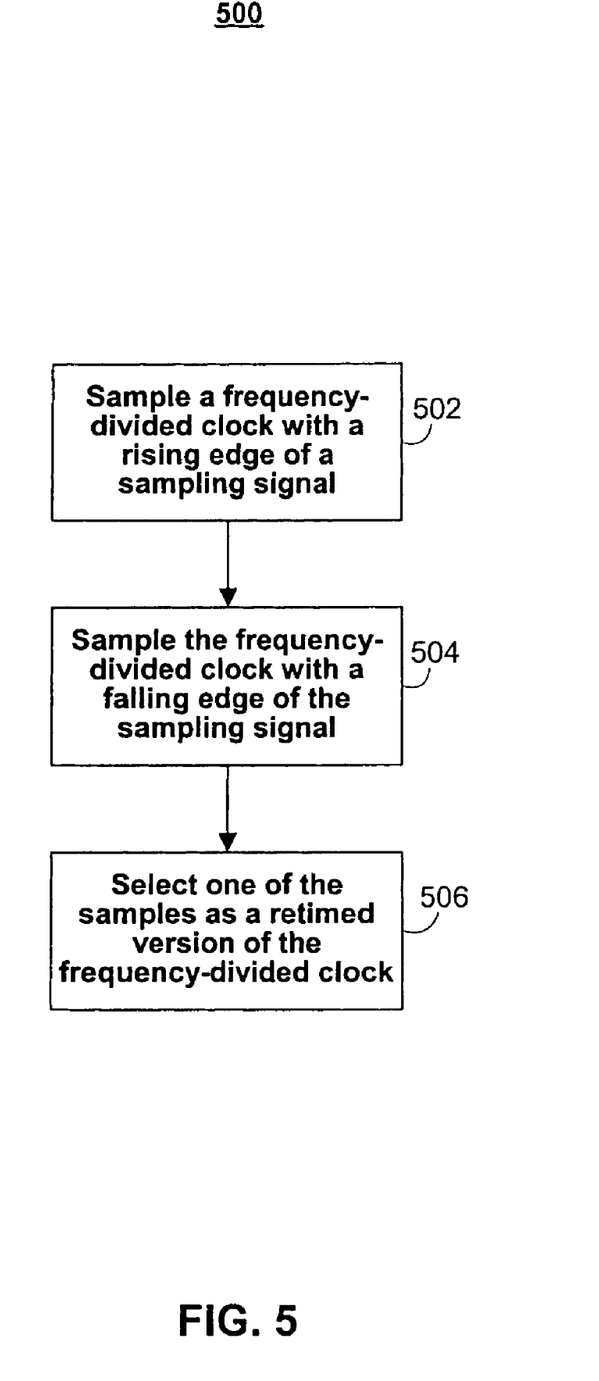
FIG. 5 is a flowchart of illustrative steps involved in retiming a frequency-divided clock in accordance with the present invention.

FIG. 5 is a flowchart 500 of illustrative steps involved in retiming a frequency-divided clock in accordance with the present invention. At step 502, the frequency-divided clock is sampled with a rising edge of a sampling clock to produce a first sample. At step 504, the frequency-divided clock is sampled with a falling edge of the sampling clock to produce a second sample. At step 506, one of the first and second samples is selected as a retimed version of the frequency-divided clock. The particular sample selected is preferably the sample less likely to produce an erroneous retimed clock.

Thus it is seen that circuits and methods for retiming a frequency-divided clock are provided. One skilled in the art will appreciate that the invention can be practiced by other than the described embodiments, which are presented for purposes of illustration and not of limitation, and the present invention is limited only by the claims which follow.

I claim:

1. A method for retiming a frequency-divided clock, said method comprising:
   sampling said frequency-divided clock with a rising edge of a sampling clock to produce a first sample;
   sampling said frequency-divided clock with a falling edge of said sampling clock to produce a second sample;
   determining whether said frequency-divided clock leads or lags said sampling clock; and
   selecting one of said first sample and said second sample as a retimed version of said frequency-divided clock based on said determining.

2. The method of claim 1, wherein said sampling said frequency-divided clock with a sampling clock comprises sampling said frequency-divided clock with a clock having a higher frequency than said frequency-divided clock.

3. The method of claim 1, wherein said selecting one of said first sample and said second sample based on said determining comprises:
   selecting said first sample as said retimed version of said frequency-divided clock when said frequency-divided clock leads said sampling clock; and
   selecting said second sample as said retimed version of said frequency-divided clock when said frequency-divided clock lags said sampling clock.

4. The method of claim 1, wherein said selecting one of said first sample and said second sample comprises:
   determining that a given sample of said first sample and said second sample was not taken during a logic transition of said frequency-divided clock; and
   selecting said given sample as said retimed version of said frequency-divided clock.

5. The method of claim 1, wherein said retimed version of said frequency-divided clock has reduced spur levels in comparison to said frequency-divided clock.

6. The method of claim 1, wherein said selecting one of said first sample and said second sample as a retimed version of said frequency-divided clock comprises outputting said retimed version of said frequency-divided clock for comparison to a reference clock.

7. The method of claim 6, further comprising:
comparing a frequency of said retimed version of said frequency-divided clock to a frequency of said reference clock;
comparing a phase of said retimed version of said frequency-divided clock to a phase of said reference clock; and
adjusting said sampling clock based on said comparing.

8. The method of claim 1, further comprising receiving said first sample and said second sample at the same time.

9. The method of claim 1, further comprising frequency dividing said sampling clock to produce said frequency-divided clock.

10. The method of claim 9, wherein said frequency dividing said sampling clock comprises:
programming a given dividing factor from a plurality of dividing factors for said frequency dividing; and
frequency dividing said sampling clock based on said given dividing factor.

11. The method of claim 1, further comprising using said method for a wireline transceiver that sends data over a cable.

12. The method of claim 11, wherein said wireline transceiver comprises a 10 Gigabit/second SONET transceiver.

13. The method of claim 11, wherein said wireline transceiver comprises a 10 Gigabit/second Ethernet transceiver.

14. The method of claim 1, further comprising using said method in a phase-locked loop implementation.

15. A method for retiming a frequency-divided clock, said method comprising:
sampling said frequency-divided clock with a rising edge of a sampling clock to produce a first sample;
sampling said frequency-divided clock with a falling edge of said sampling clock to produce a second sample;
comparing said frequency-divided clock and said sampling clock to find a difference between said clocks;
determining a change in a given condition based on said comparing;
selecting said first sample as said retimed version of said frequency-divided clock responsive to said given condition; and
selecting said second sample as said retimed version of said frequency-divided clock responsive to said determining said change in said given condition.

16. The method of claim 11, wherein said given condition comprises a process condition.

17. The method of claim 11, wherein said given condition comprises a temperature condition.

18. A retiming circuit comprising:
a first sampling circuit operative to sample a frequency-divided clock with a rising edge of a sampling clock;
a second sampling circuit operative to sample said frequency-divided clock with a falling edge of said sampling clock; and
a multiplexer in communication with said first sampling circuit and said second sampling circuit, said multiplexer operative to select one of a sample of said first sampling circuit and a sample of said second sampling circuit as a retimed version of said frequency-divided clock; and
a detector operative to:
determine whether said frequency-divided clock leads or lags said sampling clock; and
output a signal based on said determining that causes said multiplexer to select one of said sample output by said first sampling circuit and said sample output by said second sampling circuit as said retimed version of said frequency-divided clock.

19. The retiming circuit of claim 18, wherein said sampling clock has a higher frequency than said frequency-divided clock.

20. The retiming circuit of claim 18, wherein said signal causes said multiplexer to select said sample output by said first sampling circuit as said retimed version of said frequency-divided clock when said frequency-divided clock leads said sampling clock and wherein said signal causes said multiplexer to select said sample output by said second sampling circuit as said retimed version of said frequency-divided clock when said frequency-divided clock lags said sampling clock.

21. The retiming circuit of claim 18, further comprising a detector operative to:
determine that a given sample of said first and second samples output by said circuit was not taken during a logic transition of said frequency-divided clock; and
cause said multiplexer to select said given sample as said retimed version of said frequency-divided clock.

22. The retiming circuit of claim 18, wherein said retimed version of said frequency-divided clock has reduced spur levels in comparison to said frequency-divided clock.

23. The retiming circuit of claim 18, wherein said multiplexer outputs said retimed version of said frequency-divided clock for comparison to a reference clock.

24. The retiming circuit of claim 23, further comprising a phase/frequency detector in communication with said multiplexer, said phase/frequency detector operative to:
compare a frequency of said retimed version of said frequency-divided clock to a frequency of said reference clock;
compare a phase of said retimed version of said frequency-divided clock to a phase of said reference clock; and
adjust said sampling clock based on said comparison.

25. The retiming circuit of claim 18, wherein said first sampling circuit and said sampling circuit output their respective samples to said multiplexer at the same time.

26. The retiming circuit of claim 18, further comprising a frequency divider operative to frequency divide said sampling clock to produce said frequency-divided clock.

27. The retiming circuit of claim 26, wherein said frequency divider is a programmable frequency divider operative to frequency divide said sampling clock using a plurality of dividing factors, said frequency divider operative to receive a control signal that selects a given one of said plurality of dividing factors for said frequency dividing.

28. The retiming circuit of claim 18, wherein said retiming circuit is included in a wireline transceiver that sends data over a cable.

29. The retiming circuit of claim 28, wherein said wireline transceiver comprises a 10 Gigabit/second SONET transceiver.

30. The retiming circuit of claim 28, wherein said wireline transceiver comprises a 10 Gigabit/second Ethernet transceiver.

31. The retiming circuit of claim 28, wherein said retiming circuit is included in a phase-locked loop.

32. A retiming circuit comprising:
a first sampling circuit operative to sample a frequency-divided clock with a rising edge of a sampling clock;
a second sampling circuit operative to sample said frequency-divided clock with a falling edge of said sampling clock; and a multiplexer in communication with said first sampling circuit and said second sampling circuit, said multiplexer operative to select one of a sample of said first sampling circuit and a sample of said second sampling circuit as a retimed version of said frequency-divided clock; and a detector operative to:
cause said multiplexer to select said sample output by said first sampling circuit as said retimed version of said frequency-divided clock responsive to a given condition; and
cause said multiplexer to select said sample output by said second sampling circuit as said retimed version of said frequency-divided clock responsive to a change in said given condition.

33. The retiming circuit of claim 32, wherein said given condition comprises a process condition.

34. The retiming circuit of claim 32, wherein said given condition comprises a temperature condition.

35. A retiming circuit comprising:
a first sampling circuit operative to sample a frequency-divided clock with a rising edge of a sampling clock wherein said first sampling circuit comprises a plurality of latches in communication with one another;
a second sampling circuit operative to sample said frequency-divided clock with a falling edge of said sampling clock; and
a multiplexer in communication with said first sampling circuit and said second sampling circuit, said multiplexer operative to select one of a sample of said first sampling circuit and a sample of said second sampling circuit as a retimed version of said frequency-divided clock; and
a detector operative to:
determine whether said frequency-divided clock leads or lags said sampling clock; and
output a signal based on said determining that causes said multiplexer to select one of said sample output by said first sampling circuit and said sample output by said second sampling circuit as said retimed version of said frequency-divided clock.

36. The retiming circuit of claim 35, wherein said second sampling circuit comprises a second plurality of latches in communication with one another, said second plurality of latches comprising one fewer latch than said plurality of latches of said first sampling circuit.

37. A retiming circuit comprising:
means for sampling said frequency-divided clock with a rising edge of a sampling clock to produce a first sample;
means for sampling said frequency-divided clock with a falling edge of said sampling clock to produce a second sample;
means for determining whether said frequency-divided clock leads or lags said sampling clock; and
means for selecting one of said first sample and said second sample as a retimed version of said frequency-divided clock based on said determining.

38. The retiming circuit of claim 37, wherein said means for sampling said frequency-divided clock with a sampling clock comprises means for sampling said frequency-divided clock with a clock having a higher frequency than said frequency-divided clock.

39. The retiming circuit of claim 37, wherein said means for selecting one of said first sample and said second sample based on said determining comprises:
means for selecting said first sample as said retimed version of said frequency-divided clock when said frequency-divided clock leads said sampling clock; and
means for selecting said second sample as said retimed version of said frequency-divided clock when said frequency-divided clock lags said sampling clock.

40. The retiming circuit of claim 37, wherein said means for selecting one of said first sample and said second sample comprises:
means for determining that a given sample of said first sample and said second sample was not taken during a logic transition of said frequency-divided clock; and
means for selecting said given sample as said retimed version of said frequency-divided clock.

41. The retiming circuit of claim 37, wherein said retimed version of said frequency-divided clock has reduced spur levels in comparison to said frequency-divided clock.

42. The retiming circuit of claim 37, wherein said means for selecting one of said first sample and said second sample as a retimed version of said frequency-divided clock comprises means for outputting said retimed version of said frequency-divided clock for comparison to a reference clock.

43. The retiming circuit of claim 42, further comprising:
means for comparing a frequency of said retimed version of said frequency-divided clock to a frequency of said reference clock;
means for comparing a phase of said retimed version of said frequency-divided clock to a phase of said reference clock; and
means for adjusting said sampling clock based on said comparing.

44. The retiming circuit of claim 43, further comprising means for receiving said first sample and said second sample at the same time.

45. The retiming circuit of claim 37, further comprising means for frequency dividing said sampling clock to produce said frequency-divided clock.

46. The retiming circuit of claim 45, wherein said means for frequency dividing said sampling clock comprises:
means for programming a given dividing factor from a plurality of dividing factors for said frequency dividing; and
means for frequency dividing said sampling clock based on said given dividing factor.

47. The retiming circuit of claim 37, further comprising means for using said retiming circuit for a wireline transceiver that sends data over a cable.

48. The retiming circuit of claim 47, wherein said wireline transceiver comprises a 10 Gigabit/second SONET transceiver.

49. The retiming circuit of claim 47, wherein said wireline transceiver comprises a 10 Gigabit/second Ethernet transceiver.

50. The retiming circuit of claim 37, wherein said retiming circuit is included in a phase-locked loop.

51. A retiming circuit comprising:
means for sampling said frequency-divided clock with a rising edge of a sampling clock to produce a first sample;
means for sampling said frequency-divided clock with a falling edge of said sampling clock to produce a second sample;

means for comparing said frequency-divided clock and said sampling clock to find a difference between said clocks;

means for determining a change in a given condition based on said comparing;

means for selecting said first sample as a retimed version of said frequency-divided clock responsive to said given condition; and means for selecting said second sample as said retimed version of said frequency-divided clock responsive to a change in said given condition.

52. The retiming circuit of claim 51, wherein said given condition comprises a process condition.

53. The retiming circuit of claim 51, wherein said given condition comprises a temperature condition.

54. A retiming circuit comprising:

a first sampling circuit comprising first, second and third latches, said first sampling circuit operative to receive a frequency-divided clock and a sampling clock and to output a first sample of said frequency-divided clock corresponding to a rising edge of said sampling clock;

a second sampling circuit comprising fourth and fifth latches, said sampling circuit operative to receive said frequency-divided clock and said sampling clock and to output a second sample of said frequency-divided clock corresponding to a falling edge of said sampling clock;

a multiplexer operative to receive said first sample and said second sample and to select one of said first and second samples as a retimed version of said frequency-divided clock; and control circuitry comprising sixth and seventh latches, said control circuitry operative to provide a control signal that causes said multiplexer to select either said first sample or said second sample as said retimed version of said frequency-divided clock, said control circuitry operative to receive said frequency-divided clock and said sampling clock as input and to output a signal indicating whether said frequency-divided clock leads or lags said sampling clock.

55. A method for retiming a frequency-divided clock comprising:

receiving said frequency-divided clock and a sampling clock;

latching said frequency-divided clock to produce a first sample;

outputting, in response to said receiving, said first sample of said frequency-divided clock corresponding to a rising edge of said sampling clock;

latching said frequency-divided clock to produce a second sample, wherein said second sample is latched at least one more time than said first sample;

outputting, in response to said receiving, said second sample of said frequency-divided clock corresponding to a falling edge of said sampling clock;

receiving said first sample and said second sample;

selecting one of said first and second samples as a retimed version of said frequency-divided clock; and outputting, in response to said receiving said frequency-divided clock and said sampling clock, a control signal that causes either said first sample or said second sample to be selected.

56. A retiming circuit retiming circuit comprising:

means for receiving a frequency-divided clock and a sampling clock;

means for latching said frequency-divided clock to produce a first sample;

means for outputting, in response to said frequency-divided clock and said sampling clock being received by said means for receiving, said first sample of said frequency-divided clock corresponding to a rising edge of said sampling clock;

means for latching said frequency-divided clock to produce a second sample, wherein said second sample is latched at least one more time than said first sample;

means for outputting, in response to said frequency-divided clock and said sampling clock being received by said means for receiving, said second sample of said frequency-divided clock corresponding to a falling edge of said sampling clock;

means for receiving said first sample and said second sample;

means for selecting one of said first and second samples as a retimed version of said frequency-divided clock; and means for outputting, in response to said receiving of said frequency-divided clock and said sampling clock by said means for receiving, a control signal that causes either said first sample or said second sample to be selected by said means for selecting.

* * * * *